United States Patent [19]

Fan

[11] Patent Number: 5,782,996
[45] Date of Patent: Jul. 21, 1998

[54] GRADED COMPOSITIONS OF II-VI SEMICONDUCTORS AND DEVICES UTILIZING SAME

[75] Inventor: Yongping Fan, Dallas, Tex.

[73] Assignee: Philips Electronics North America Corporation, New York, N.Y.

[21] Appl. No.: 520,443

[22] Filed: Aug. 29, 1995

[51] Int. Cl.$^6$ ............................................. C30B 29/49
[52] U.S. Cl. ..................... 148/33.1; 148/33.2; 148/33.3; 117/89; 117/92; 117/105; 438/288
[58] Field of Search .................... 117/89, 92, 105, 117/956; 437/128; 148/33.1, 33.2, 33.3; 138/288

[56] References Cited

U.S. PATENT DOCUMENTS

| | | | |
|---|---|---|---|
| 5,023,685 | 6/1991 | Bethea et al. | 357/30 |
| 5,170,407 | 12/1992 | Schubert et al. | 357/96 |
| 5,294,833 | 3/1994 | Schetzina . | |
| 5,351,255 | 9/1994 | Schetzina | 372/45 |

OTHER PUBLICATIONS

"Optimization of Compositional Grading in Zn (Se,Te) Graded Ohmic Contacts to P–Type ZnSe" Y. Fan, Appl. Phys. Lett. vol. 67, No. 12, Sep. 1995, pp. 1739–1741.

"Optimization of Ohmic Contacts to ZnSe by Parabolic Grading of ZnSe–Te Composition" G.L. Yang et al, Physica Status Solidi(B) Basic Research Berlin, vol. 187, No. 2, Feb. 1995, pp. 435–438.

J. Qui et al. J. Cryst. Growth. 127, 279 (1993).
Y. Lansari et al. Appl. Phys. Lett. 61, 2554 (1992).
Y. Fan et al. Appl. Phys. Lett., 61, 3160 (1992).
Y. Fan et al., J. Vac. Sci. Technol. B12, 2480 (1994).
P.M. Mensz, Appl. Phys. Lett., 64, 2148 (1994).
R.G. Dandrea et al., Appl. Phys. Lett., 64, 2148 (1994).
N. Nakayama et al. Electron. Lett. 29, 1488 (1993).
A. Salokatve et al.. Electron. Lett. 29, 2192 (1993).
Cheung et al., in Solid State Electron. 18, 263 (1974).
J. R. Hayes et al., Appl. Phys. Lett. 43, 949 (1983).

*Primary Examiner*—Robert Kunemund
*Attorney, Agent, or Firm*—John C. Fox

[57] ABSTRACT

A graded layer composition of Zn(Se,Te) in which the Te fraction varies across the layer in a super-parabolic grading profile. Such a graded layer has lower contact resistance than graded layers in which the Te fraction varies in a linear or parabolic grading profile. Such low contact resistance makes such graded layers useful in forming ohmic contacts for II–VI semiconductor lasers and light emitting diodes.

8 Claims, 4 Drawing Sheets

GRADED COMPOSITIONS OF II-VI SEMICONDUCTORS AND DEVICES UTILIZING SAME

BACKGROUND OF THE INVENTION

This invention relates to II-VI semiconductor compounds, and more particularly relates to graded compositions in the II-VI system, such as the ternary system Zn(Se,Te), and also relates to devices incorporating such graded compositions as ohmic contacts.

Since the successful p-type doping of ZnSe and the realization of the first blue green laser diodes in 1991, much attention has been paid to the problem of fabricating low resistance ohmic contacts to p-type wide band gap II-VI compounds (ZnSe, ZnSSe, and ZnMgSSe). The excessive heat produced at metal/semiconductor Schottky contacts accelerates defect propagation/multiplication and therefor shortens the device lifetime. No suitable metal or metal alloy having a sufficiently high work function (6.7 eV)(to avoid the formation of an energy barrier) has been found to make ohmic contact to p-type ZnSe.

Since early 1992 three different ohmic contact schemes have been fabricated: a heavily nitrogen-doped ZnSe layer grown at a low temperature (J. Qui et al., J. Cryst. Growth, 12, 279 (1993)); a semi-metallic HgSe layer (Y. Lansari et al., Appl. Phys. Lett. 61, 2554 (1992)); and a graded bandgap Zn(Se,Te) layer atop p-type ZnSe (Y. Fan et al., Appl. Phys. Lett., 61, 3160 (1992) and Y. Fan et al., J. Vac. Sci. Technol. B12, 2480 (1994)). Recently, the use of BeTe has been proposed (P. M. Mensz, Appl. Phys. Lett., 64, 2148 (1994) and R. G. Dandrea et al., Appl. Phys. Lett., 64, 2145 (1994)). However, to date, the graded Zn(Se,Te) layer has proved the most promising, despite the difficulty in controlling the Te fraction due to competition between Te and Se on the growth plane.

By employing a multilayer structure of ZnSe and ZnTe to approximate continuous grading, several groups around the world have successfully demonstrated room temperature continuous wave (CW) operation of blue-green laser diodes. (N. Nakayama et al., Electron. Lett. 29, 1488 (1993); A. Salokatve et al., Electron. Lett. 29, 2192 (1993).

Because of the large lattice mismatch between ZnSe and ZnTe, the graded bandgap contact layer should be kept as thin as possible to minimize the formation of dislocations. In order to have a smooth valence band profile while using such a thin graded layer, the compositional grading style of the ZnTe should be optimized.

Theoretically, the energy band diagram of such a graded heterojunction can be obtained by solving Poisson's equation. Unfortunately, this requires extensive numerical computation. A simplified model for the reduction of a conduction band energy spike was discussed by Cheung et al., in Solid State Electron. 18, 263 (1974), and later used by J. R. Hayes et al., Appl. Phys. Lett., 43, 949 (1983), to design a graded Ga(Al,As) emitter for heterojunction bipolar transistors in the III-V system. By assuming an approximation of the depletion layer, they showed that the conduction band potential can be minimized by introducing a parabolic grading potential, which can be realized by a parabolic compositional grading in the Ga(Al,As) system.

OBJECTS AND SUMMARY OF THE INVENTION

It is an object of the invention to provide a II-VI semiconductor graded band gap layer having a smooth valence band profile.

It is another object of the invention to provide such a layer with a parabolic variation of the valence band edge.

It is yet another object of the invention to provide such a layer having a low specific contact resistance.

It is yet another object of the invention to provide such a layer as a low resistance ohmic contact in a II-VI semiconductor device.

Due to the strong bowing effect of band gap energy in Zn(Se,Te) and other ternary and quaternary II-VIs, parabolic compositional grading cannot be used to produce a parabolic variation of valence band edge in these systems.

In accordance with the invention, it has been found that a super-parabolic grading profile, that is, a profile having a greater deviation from a linear profile than a parabolic profile, in a graded II-VI semiconductor composition results in a lower specific contact resistance to a II-VI semiconductor compound layer than either a linear profile or a parabolic profile.

In accordance with a preferred embodiment of the invention, the graded profile fits or at least approximates the function:

$$c(x) = (Eg_2 - Eg_1 + \chi_2 - \chi_1 + b)/2b - [Eg_2 - Eg_1 + \chi_2 - \chi_1 + b)^2 - 4bqV_0(1-x/w)^2]^{1/2}/2b \quad (1)$$

where: $c(x)$ in the anion fraction, $Eg$ is the bandgap energy, $\chi$ is the difference between the conduction band edge and an internal reference level, $b$ is the bowing factor, $q$ is the electronic charge, $w$ is the graded layer thickness, and $V_0$ is the electrostatic potential at $x=0$.

DESCRIPTION OF THE PREFERRED EMBODIMENTS

Figure 1:
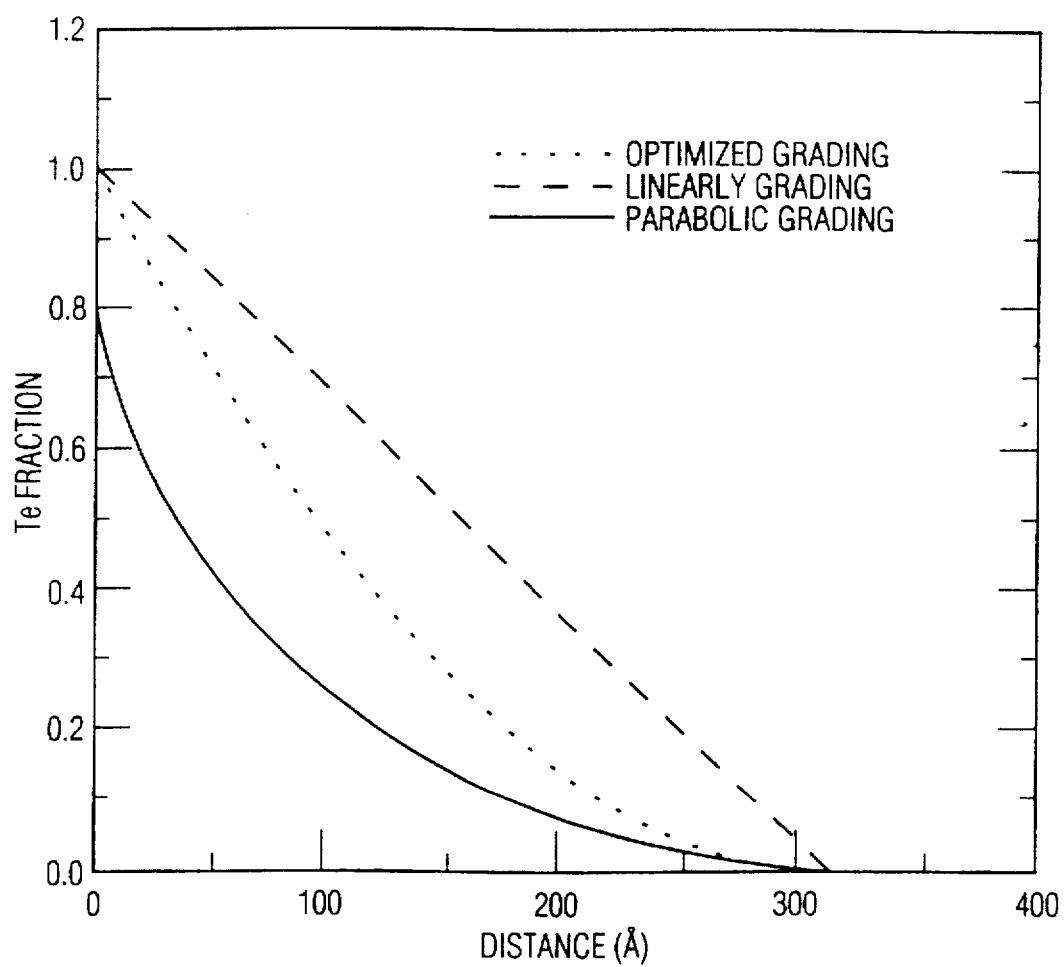
FIG. 1 is a graphical representation of the grading profiles of three different Zn(Se,Te) graded compositions, expressed as Te fraction versus distance in Angstroms.

Referring now to FIG. 1, the Te fraction in a graded Zn(Se,Te) composition is plotted versus distance from a ZnTe capping layer in which the Te fraction is 1.0, to a ZnSe layer in which the Te fraction is zero. The dashed line represents a linear grading profile in which the Te fraction changes linearly with distance. The dotted line represents a profile in which the Te fraction varies parabolicly with distance, and the solid line represents a so-called super-parabolic profile of the invention, in which the Te fraction exhibits a greater deviation from linearity than in the case of the parabolic profile. This optimized grading style can be achieved by either a single layer in which the Te fraction is continuously changed, so-called continuous grading, or by a multilayer structure in which ZnSe and ZnTe layers of different thicknesses are alternately formed. This latter technique is sometimes referred to as digital grading.

Figure 2:
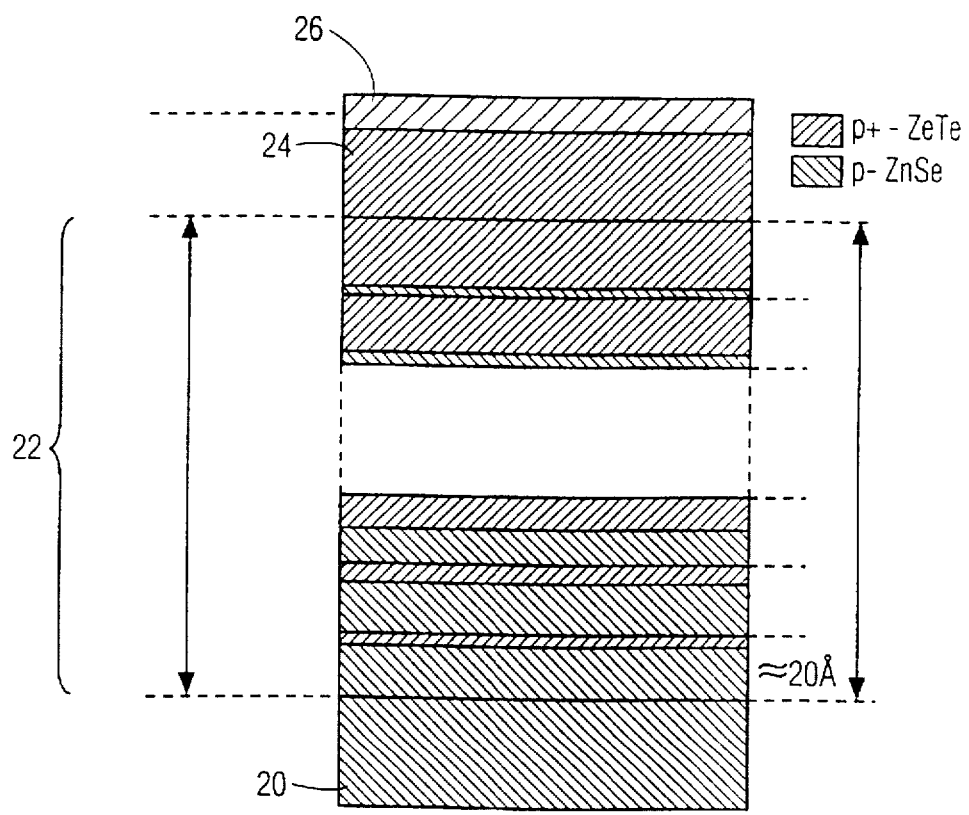
FIG. 2 is a schematic representation in cross section of a graded Zn(Se,Te) multilayer structure having a super-parabolic grading profile of the invention.

FIG. 2 shows one example of a typical digitally graded structure of the invention, in which a digitally graded region 22 is formed on a bottom layer 20 of ZnSe. A capping layer 24 of ZnTe is formed on top of graded region 22, and metal electrode 26 on top of layer 24 completes the ohmic contact structure. Region 22 is made up of 17 cells, each about 20 Angstroms thick, and each consisting of one ZnSe and one ZnTe layer. The thicknesses of the layers in the cells are changed from cell to cell in order to approximate the desired optimized compositional grading of the region 22.

In the example given, the thicknesses of the ZnTe layers in the cells are simply determined by taking the Te fractions at 20 Angstrom intervals starting at zero in FIG. 1, and multiplying the fractions by 20 Angstroms.

In accordance with a preferred embodiment of the invention, an optimized super-parabolic profile function which compensates for the bowing effect of the bandgap energy in a ternary system can be derived starting with a simplified model. The valence band edge of a semiconductor heterojunction can be expressed by the well-known expression $$E_v(x)+E_0-qV(x)-\chi(x)-E_g(x) \quad (2)$$

where $E_0$ is a reference energy level, $V(x)$ is the electrostatic potential, $\chi$ is the difference between the conduction band edge and an internal reference level (sometimes called the vacuum level), and $E_g(x)$ is the bandgap energy. The distance x is measured from the heterojunction interface. Equation (2) implies that the valence band can be obtained by superposition of the grading potential $qV_g(x)=E_0-E_g(x)-\chi(x)$ and the electrostatic potential. In order to reduce the valence band barrier height as much as possible, setting $dE_v/dx=0$ will result in approximately a flat valence band profile at $x>0$. From eq. (2)

$$E_g(x)+E_{g1}+\chi 1+qV_0-\chi(x)-qV(x) \quad (3)$$

where $E_{g1}$ and $\chi 1$ are parameters of ZnTe and $V_0$ is the electrostatic potential at $x=0$.

It is well known that when two p-type semiconductors are brought into contact with each other, the holes will be depleted near the interface in the semiconductor with a lower valence band maximum, leaving an accumulation layer of holes in the other. Considering the case where the Fermi level position with respect to the valence band of each semiconductor is about the same, $qV_0=E_{g2}-E_{g1}+\chi 2-\chi 1-qV_a=E_{g2}-E_{g1}+\chi 2-\chi 1$, since the voltage drop across the accumulation layer $V_a$ is much small than that of depletion layer. Note that the energy bandgap of $ZnTe_cSe_{1-c}$ at x can also be expressed as $$E_g(x)=c(x)E_{g1}+(1-c(x))E_{g2}-c(x)(1-c(x))b \quad (4)$$

where $b=1.27$ eV is the bowing factor and $E_{g2}$ is the band gap energy of ZnSe. Assuming $\chi(x)$ is a linear function of Te fraction $c(x)$ in the ternary layer, then from equation (3) and (4) we have $$c(x)=\{(E_{g2}-E_{g1}+\chi 2-\chi 1+b)/2b-[(E_{g2}-E_{g1}+\chi 2-\chi 1+b)^2-4bqV_0(1-x/w)^2]^{1/2}/2b\} \quad (1)$$

where the depletion layer approximation has been used for $V(x)$ (since the difference in average dielectric constant of ZnSe and Zn(Se,Te) is less than 5%) and w is the depletion layer thickness as well as the graded layer thickness since they have been assumed to have the same value for the derivation of equation (5). As expected, the Te fraction c(x) changes parabolically with distance x when the bowing factor approaches zero. When the grading length is smaller than the depletion layer thickness, a residual barrier to holes will exist. In this case equation (5) can be used to study the residual barrier height as a function of graded layer thickness for a given doping concentration. The use of more accurate expressions for the electrostatic potential of the heterojunction in equation (5) will give better results.

The optimized compositional grading is derived under assumptions which normally are not completely satisfied in practical Zn(Se,Te) graded heterostructure devices. Nevertheless, it can be used as an approximation of the true optimized grading in the numerical analysis, and gives much better results than either parabolic or linear grading under same doping condition.

Figure 3:
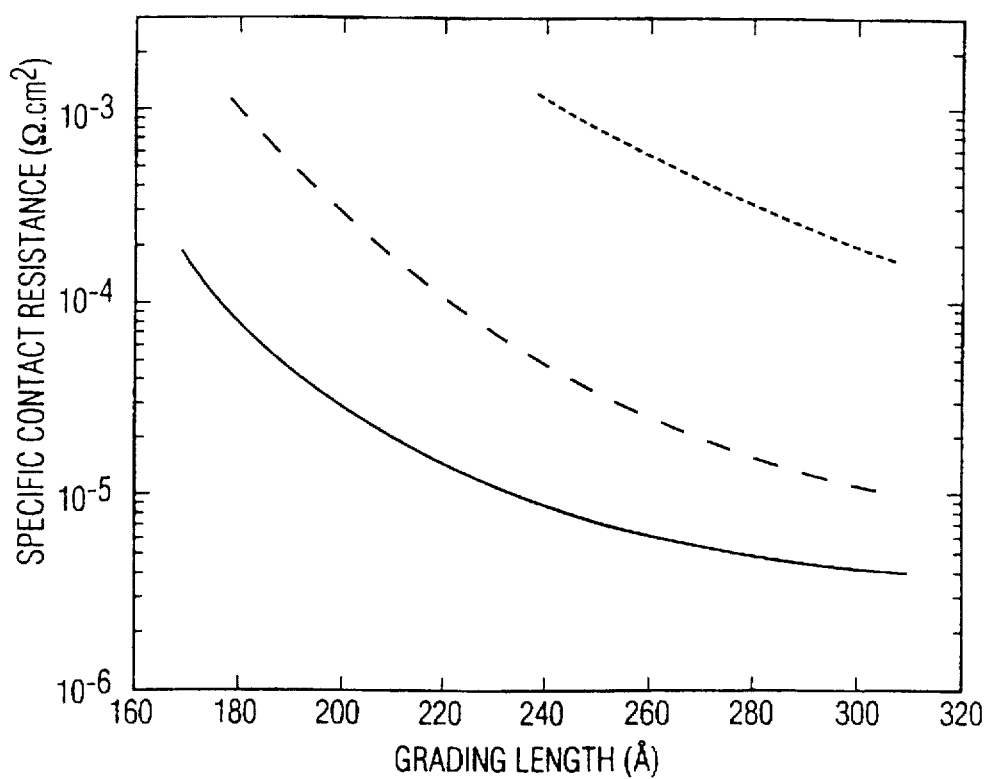
FIG. 3 is a graphical representation of specific contact resistance in $\Omega\cdot cm^2$ versus grading length (graded layer thickness) in Angstroms (Å) of the three Zn(Se,Te) graded compositions of FIG. 1.

FIG. 3 shows the specific contact resistance as functions of graded layer thickness for all three grading styles. The acceptor doping concentration in ZnTe and ZnSe are $1\times 10^{19}$ cm$^{-3}$ and $1\times 10^{18}$ cm$^{-3}$, respectively. It is evident that the optimized grading style of the invention gives much lower specific contact resistances over the whole range of grading length, and for a given specific contact resistance, the optimized grading needs a much lower grading length than either parabolic or linear grading. For example, a specific contact resistance of $2\times 10^{-4}$ $\Omega$cm$^2$ (which will result in a voltage drop of 0.2 volts at a device current density of 1 kA/cm$^2$) requires a grading length of 170 Å for the optimized grading, 210 Å for parabolic grading and 310 Å for linear grading. Over a grading distance of 170 Å to 310 Å, the specific contact resistance of the proposed optimized compositional grading is about two orders of magnitude lower than that of a linear grading. It is about one order of magnitude lower than that of a parabolic grading for grading distance less than 220 Å. At a fixed grading length of 240 Å, the specific contact resistance for optimized, parabolic and linear grading style is $8.4\times 10^{-6}$ $\Omega$cm$^2$, $4.9\times 10^{-5}$ $\Omega$cm$^2$, and $1.2\times 10^{-3}$ $\Omega$cm$^2$ respectively.

The specific contact resistance strongly depends on the doping level in p-type ZnSe and the grading length. For example, for $N_a=1\times 10^{19}$ cm$^{-3}$ in ZnTe layer and a grading length of 300 Å, a nitrogen doping level of $5.10^{17}$ cm$^{-3}$ in ZnSe gives a specific contact resistance of $1.7\times 10^{-5}$ $\Omega$cm$^2$ for the optimized grading, $9.3\times 10^{-5}$ $\Omega$cm$^2$ for parabolic grading and $1.9\times 10^{-3}$ $\Omega$cm$^2$ for linear grading, which are about a half to one order of magnitude larger than those obtained when the acceptor doping concentration in ZnSe reaches $1\times 10^{18}$cm$^{-3}$.

Figure 4:
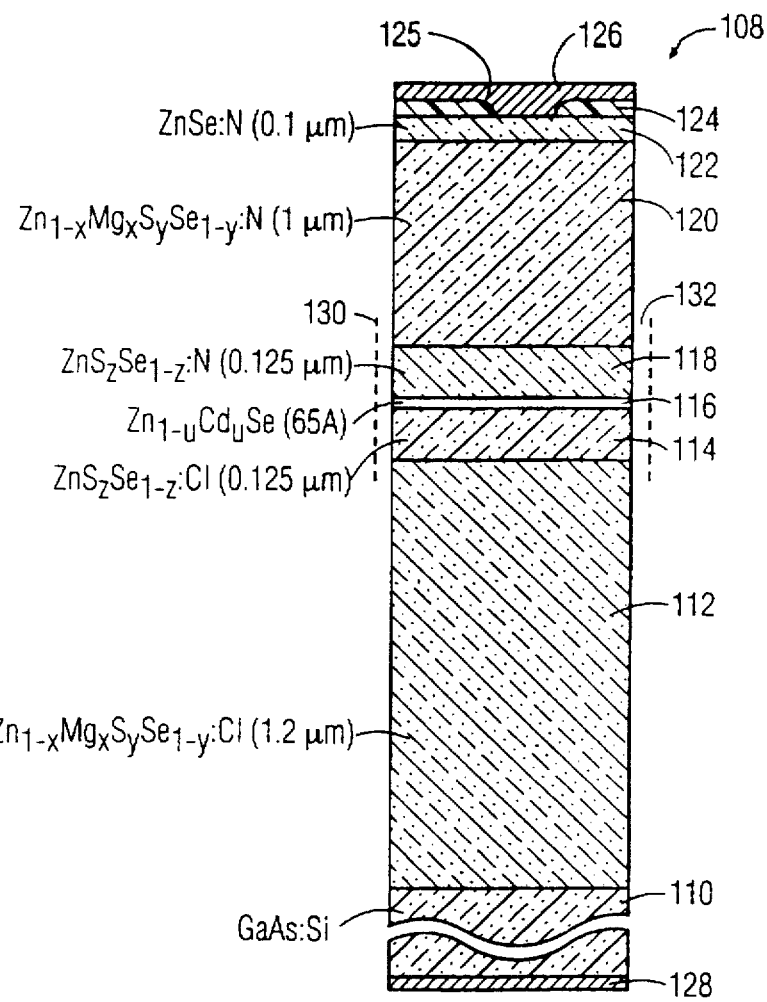
FIG. 4 is a schematic representation in cross section of a II-VI semiconductor laser structure having an ohmic contact incorporating a multilayer contact region including a Zn(Se,Te) graded composition of the invention.

Referring now to FIG. 4, there is shown a cross section of a II–VI gain guided laser device structure incorporating a graded contact of the invention. The structure includes a GaAs:Si substrate 110 which, by doping with silicon, is n-type. Grown on the substrate is a cladding layer 112 of $Zn_{1-x}Mg_xS_ySe_{1-y}$:Cl, which, by its doping with Cl is n-type. Grown atop cladding layer 120 is an optical guiding layer 114 of $ZnS_zSe_{1-z}$:Cl, which is also n-type. Grown atop layer 114 is the active quantum well layer 116 of $Zn_{1-u}Cd_uSe$. Grown on active layer 116 is a p-type guiding layer 118 comprising $ZnS_zSe_{1-z}$:N. Grown atop guiding layer 118 is a p-type cladding layer 20 of $Zn_{1-x}Mg_xS_ySe_{1-y}$:N. Disposed on layer 120 is a contact layer 122. A polymidide insulator layer 124 with stripe opening 125 of 50 μm width is applied to the top of epitaxial layer 122. Contacts to the p-ZnSe:N and the n-GaAs:Si were made with a Au layer 126 and an In layer 128, respectively.

In the above described embodiment of FIG. 4, the substrate and lower layers are n-type with the upper layers p-type. An analogous structure can be grown with the lower layers p-type and the upper layers n-type. A more detailed description of this structure may be found in U.S. Pat. No. 5,363,395, assigned to the present Assignee, and incorporated herein by reference.

Figure 5:
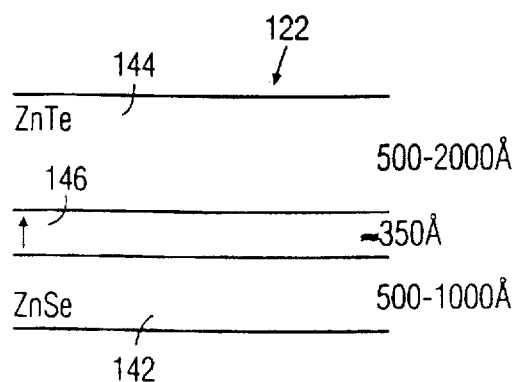
FIG. 5 is a diagrammatic representation of the multilayer contact region of FIG. 4.

FIG. 5 illustrates the contact layer 122 of FIG. 4, which includes a lower portion 142 of p-type ZnSe:N, and an upper portion 144 of p-type ZnTe:N. Between lower layer 142 and upper layer 144 is a layer 146 which is graded from ZnSe to ZnTe in accordance with the teachings of the invention. Exemplary thicknesses for layers 142, 144 and 146, as shown in FIG. 5, are 500–1000 Å for layer 142, approximately 350 Å for graded layer 146 and 500–2000 Å for layer 144.

Graded layer 146 may be formed by continuously reducing the amount of selenium and increasing the amount of tellurium during the formation of layer 146, e.g., by MBE growth. Alternatively, layer 146 may be digitally graded by laying down a series of extremely thin layers.

While the invention has been described in terms of a limited number of embodiments, other embodiments and variations of embodiments will become apparent to those skilled in the art, and it is to be understood that such variations and modifications are intended to be encompassed within the scope of the appended claims.

What I claim as my invention is:

1. A graded composition of a II–VI semiconductor of at least one Group II cation and at least two Group VI anions, in which the fraction of the Group VI anions varies in a super-parabolic grading profile.

2. The graded composition of claim 1 in which the super-parabolic grading profile is defined by the relationship $$c(x) = (Eg_2 - Eg_1 + \chi_2 - \chi_1 + b)/2b - [Eg_2 - Eg_1 + \chi_2 - \chi_1 + b)^2 - 4bqV_0(1 - x/w)^2]^{1/2}/2b$$

where:

$c(x)$ in the fraction of one of the Group VI anions, Eg is the bandgap energy, $\chi$ is the difference between the conduction band edge and an internal reference level, b is the bowing factor, q is the electronic charge, w is the grading length, and $V_0$ is the electrostatic potential at x=o.

3. The graded composition of claim 1 in which the Group II cation is Zn and the Group VI anions are Se and Te.

4. A contact region incorporating the graded composition of claim 1.

5. The contact region of claim 4 in which the graded composition is sandwiched between top and bottom layers of a II–VI semiconductor of the Group II cation and one of the Group VI anions present in the graded composition, the top layer having one of the anions and the bottom layer having the other anion.

6. The contact region of claim 5 in which the Group II cation is Zn and the Group VI anions are Se and Te.

7. The contact region of claim 6 in which the fraction of Te in the graded composition varies from zero to one from the bottom layer to the top layer, and the bottom layer is ZnSe and the top layer is ZnTe.

8. A II–VI semiconductor light emitting diode incorporating the contact region of claim 5.

* * * * *